(12) United States Patent
Chang et al.

(10) Patent No.: US 6,566,203 B2
(45) Date of Patent: May 20, 2003

(54) METHOD FOR PREVENTING ELECTRON SECONDARY INJECTION IN A POCKET IMPLANTATION PROCESS

(75) Inventors: Kent Kuohua Chang, Taipei (TW); Samuel Cheng-Sheng Pan, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/682,341

(22) Filed: Aug. 22, 2001

(65) Prior Publication Data

US 2002/0119645 A1 Aug. 29, 2002

(30) Foreign Application Priority Data

Feb. 23, 2001 (TW) .......................................... 90104263 A

(51) Int. Cl.[7] ................. H01L 21/8234; H01L 21/8236; H01L 21/8238; H01L 21/336; H01L 21/425
(52) U.S. Cl. ...................... 438/275; 438/276; 438/199; 438/302; 438/786; 438/514; 438/525
(58) Field of Search ............................... 438/786, 276, 438/275, 199, 302, 525, 514, 299, 301, 306, 307, 209, 230, 297

(56) References Cited

U.S. PATENT DOCUMENTS

| 5,895,243 A | * | 4/1999 | Doan et al. | 438/297 |
|---|---|---|---|---|
| 5,913,136 A | * | 6/1999 | Deleonibus | 438/586 |
| 5,920,784 A | * | 7/1999 | Lee | 438/307 |
| 5,976,937 A | * | 11/1999 | Rodder et al. | 438/275 |
| 6,030,871 A | * | 2/2000 | Eitan | 438/276 |
| 6,207,482 B1 | * | 3/2001 | Shih et al. | 438/199 |
| 6,281,076 B1 | * | 8/2001 | Choi et al. | 438/257 |
| 6,306,712 B1 | * | 10/2001 | Rodder et al. | 438/289 |
| 6,472,184 B1 | * | 10/2002 | Doi et al. | 438/305 |
| 6,479,859 B2 | * | 11/2002 | Hsieh et al. | 257/315 |
| 6,482,697 B1 | * | 11/2002 | Shirai | 438/257 |
| 6,482,699 B1 | * | 11/2002 | Hu et al. | 438/258 |

FOREIGN PATENT DOCUMENTS

| JP | 405095001 A | * | 4/1993 |
|---|---|---|---|
| JP | 405109768 A | * | 4/1993 |
| JP | 505129337 A | * | 5/1993 |
| JP | 406089906 A | * | 3/1994 |
| JP | 406232071 A | * | 8/1994 |
| JP | 406291074 A | * | 10/1994 |

* cited by examiner

Primary Examiner—Caridad Everhart
Assistant Examiner—Chuong Anh Luu
(74) Attorney, Agent, or Firm—Winston Hsu

(57) ABSTRACT

A method for preventing electron secondary injection in a pocket implantation process performed on a nitride read only memory (NROM). The NROM has an oxide-nitride-oxide (ONO) layer formed on a silicon substrate. A plurality of bit line masks, arranged in a column, is formed on the surface of the ONO layer. A plurality of N type bit lines is formed in a region of the substrate not covered by the bit line masks. The method starts by performing a pocket implantation process of Indium ions with low energy, high dosage and using an angle nearly parallel to the ONO layer, so as to prevent electron secondary injection. Also, a plurality of P-type ultra-shallow junctions is formed in the region of the substrate not covered by the bit line masks.

7 Claims, 4 Drawing Sheets

METHOD FOR PREVENTING ELECTRON SECONDARY INJECTION IN A POCKET IMPLANTATION PROCESS

BACKGROUND OF THE INVENTION

1. Field of the Invention

The present invention relates to a method of performing a pocket implantation process to a nitride read only memory (NROM), and more particularly, to a method of preventing electron secondary injection in the pocket implantation process.

2. Description of the Prior Art

Nitride read only memory (NROM) is a semiconductor device used to store data, which is composed of a plurality of memory cells. Each memory cell comprises a control gate and a gate dielectric layer of oxide-nitrogen-oxide (ONO) structure. Because the silicon nitride layer of the ONO layer is highly compact, hot electrons injecting through tunneling oxide into the silicon nitride layer are trapped. As a result the silicon nitride layer may be used as a floating gate for storing data.

Please refer to FIG. 1 to FIG. 6. FIG. 1 to FIG. 6 are cross-sectional diagrams of a method of forming an NROM cell according to the prior art. As shown in FIG. 1, an NROM cell is formed on the surface of a P-type silicon substrate 10. The prior art method first performs an ONO process on the surface of the P-type silicon substrate 10 to form an ONO dielectric layer 18 composed of a bottom oxide layer 12, a silicon nitride layer 14 and a top oxide layer 16. A photolithographic process is employed to form a photoresist layer 20 on the surface of the ONO dielectric layer 18. The photoresist layer 20 forms patterns to define positions of bit lines.

As shown in FIG. 2, the photoresist layer 20 is used as a mask for performing an anisotropic etching process to remove the top oxide layer 16 and the silicon nitride layer 14 not covered by the photoresist layer 20. Following that, an ion implantation process 22 is performed to form a plurality of N-type doped areas 24 in the silicon substrate 10 that function as bit lines, i.e. buried drains of the memory device. Two neighboring doped areas 24 define a channel, and the distance between the two neighboring doped areas 24 is defined as channel length. The ion implantation process 22 is performed perpendicular to the surface of the silicon substrate 10 using an arsenic (As) ion concentration of $1 \times 10^{14} \sim 1 \times 10^{16}/cm^2$ and having an energy ranging from 20 KeV to 200 KeV at room temperature.

As shown in FIG. 3, an ion implantation process with a first oblique angle 26 is performed to form a P-type pocket doped area 28 on one side of each doped area 24. Then, as shown in FIG. 4, an ion implantation process with a second oblique angle 27 is performed to form a P-type pocket doped area 29 on the other side of each doped area 24. The two ion implantation processes 26 and 27 have approximately the same ion implantation parameters.

The two ion implantation processes have a first oblique angle 26 and a second oblique angle 27, the angles both ranging from 20° to 45°. Both implantation processes use $BF_2^+$ as a dopant, with a dosage ranging from $1 \times 10^{14}/cm^2$ to $1 \times 10^{16}/cm^2$, and an energy ranging from 20 KeV to 150 KeV. Under these parameters, the $BF_2^+$ dopants mostly concentrate in the silicon substrate 10 to a depth of about 1000 Angstroms (Å) under the channel.

The advantage of forming P-type doped areas 28 and 29 is that it provides a high electric field area on one side of the channel. The high electric field area can increase the speed of electrons passing through the channel during a programming process. In other words, electrons accelerated to higher speeds can obtain enough kinetic energy to pass through the oxide layer 12 into the silicon nitride layer 14 by way of collision or scattering, so as to improve programming efficiency.

Following, as shown in FIG. 5, a photoresist ashing process (or a photoresist stripping process) is performed to remove the photoresist layer 20. The prior art method to remove the photoresist layer 20 is performed in a plasma processing chamber. The plasma processing generally comprises a top electrode, which is normally connected to an RF generator, and a bottom electrode, which is usually grounded. A mixed photoresist ashing gas comprising oxygen and helium is used to generate plasma so as to quickly clean away the photoresist layer 20.

Then, as shown in FIG. 6, a thermal oxidation method with a temperature of 900° C.~1150° C. is used to form a field oxide layer 32 on a top surface of the bit lines 24 so as to separate each silicon nitride layer 14. Finally, a doped polysilicon layer 34 is deposited and functions as a word line. The dopants implanted into the silicon substrate 10 previously, including the dopants in the doped areas 24, 28 and 29, can be activated during the formation of the field oxide layer 32.

To improve programming efficiency, it is better to distribute the highest concentration of dopants in the P-type doped areas 28 and 29 near the surface of the silicon substrate 10, at a depth less than 500 Angstroms (Å). The above-mentioned prior art method for manufacturing NROM performs two ion implantation processes, using $BF_2^+$ as dopants, at oblique angles 26 and 27, leading to the following problems. Because boron ions have a high diffusibility, the P-type doped areas 28 and 29 formed by the prior art method have a deep junction. Furthermore, electron secondary injection occurs to form an electron tail and a wider charge distribution. Therefore, electric holes cannot completely recombine with electrons in the subsequent operation of erase state, resulting incomplete erasing or long erasing time.

SUMMARY OF INVENTION

It is therefore a primary objective of the present invention to provide a method of preventing electron secondary injection in the pocket implantation process of a nitride read only memory (NROM).

The present invention provides a method to provide an NROM comprising an ONO layer formed on a silicon substrate. A plurality of bit line masks arranged in a column is formed on the surface of the ONO layer. A plurality of N-type bit lines is formed in the region of the substrate not covered by the bit line masks. A pocket implantation process using Indium ions is performed, having an angle nearly parallel to the ONO layer. The process implants to the region of the substrate not covered by the bit line masks, forming a plurality of P-type ultra-shallow doped areas. The Indium ions in the ultra-shallow doped area are activated to form an ultra-shallow junction on the surface of the silicon substrate. The pocket implantation process is an ion implantation process using a low energy and a high dosage to prevent electron secondary injection during the pocket implantation process.

It is an advantage of the present invention that the method performs a pocket implantation process using Indium ions as dopants so as to eliminate electron secondary injection and facilitate faster programming and shorter erase time.

DETAILED DESCRIPTION

Figure 1:
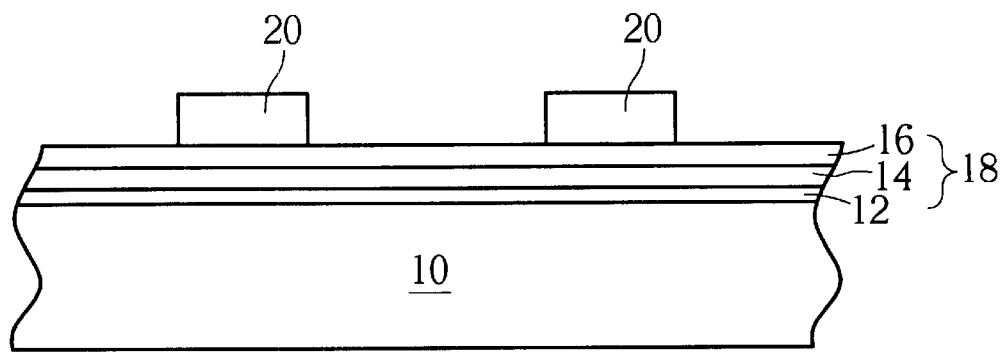
FIG. 1 to FIG. 6 are cross-sectional diagrams of a method of forming an NROM according to the prior art.
Figure 2:
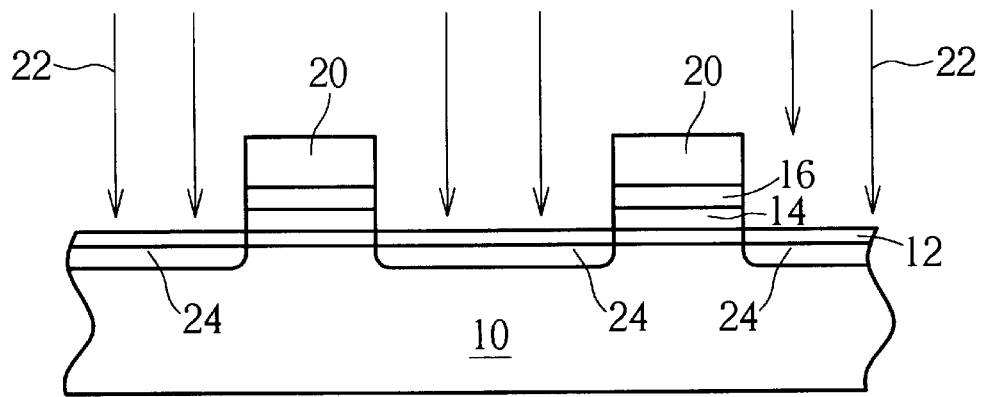
Figure 3:
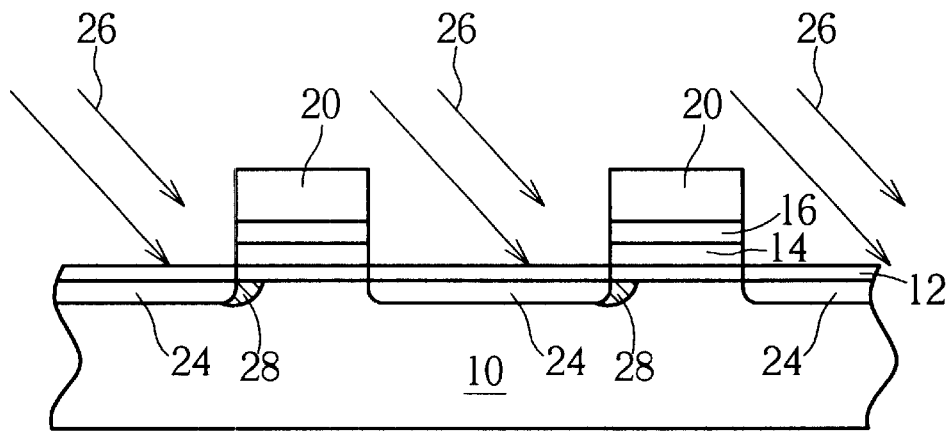
Figure 4:
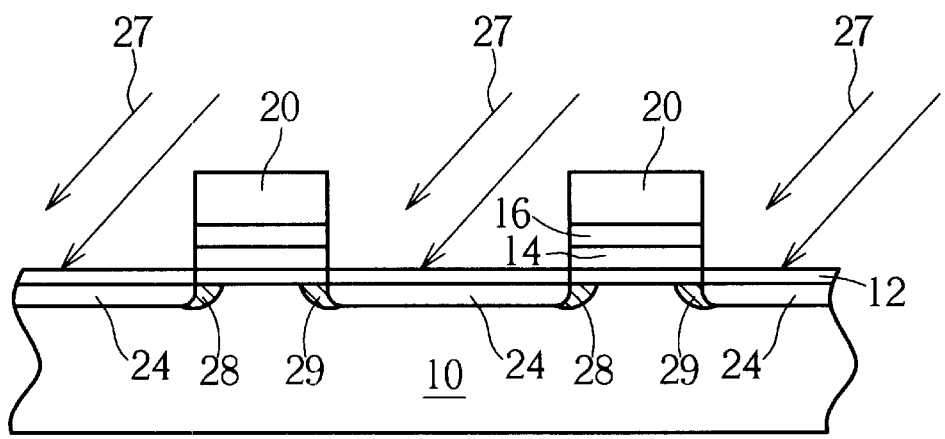
Figure 5:
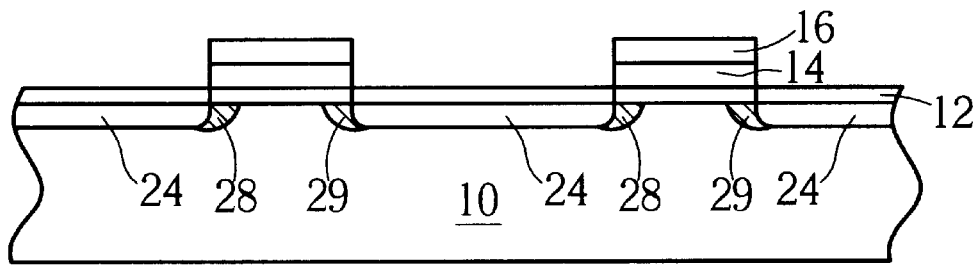
Figure 6:
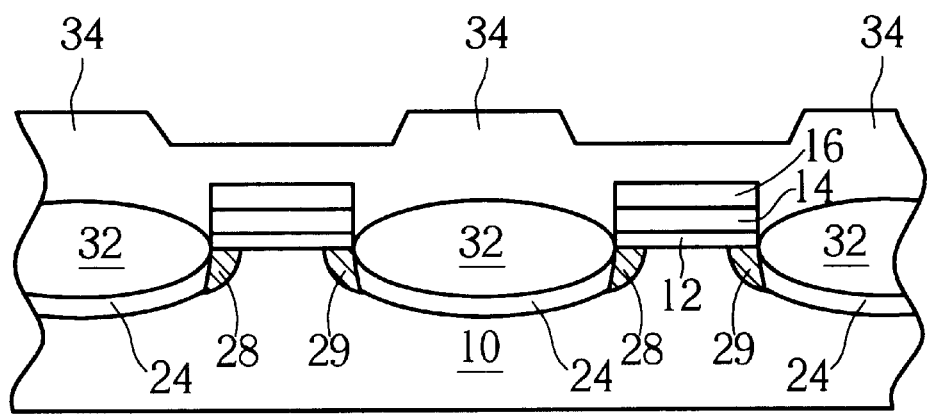
Figure 7:
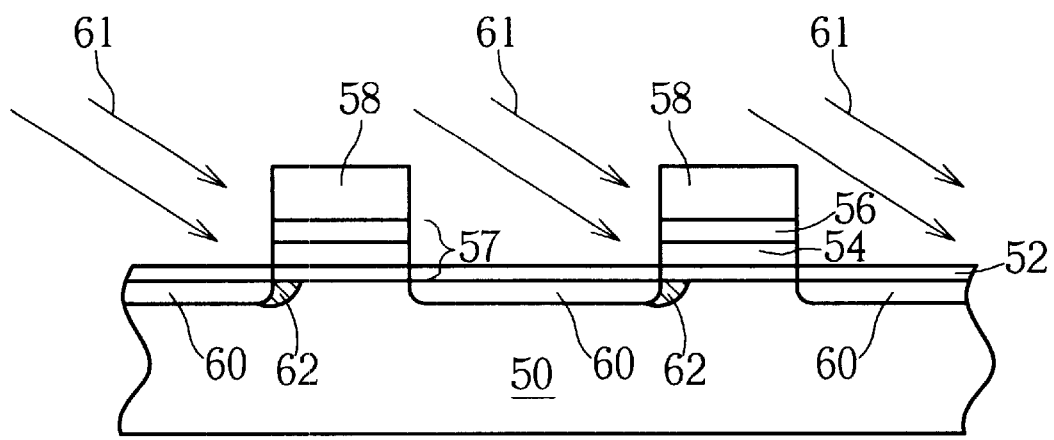
FIG. 7 and FIG. 8 are cross-sectional diagrams of a method of performing a pocket implantation process to the NROM according to the present invention.
Figure 8:
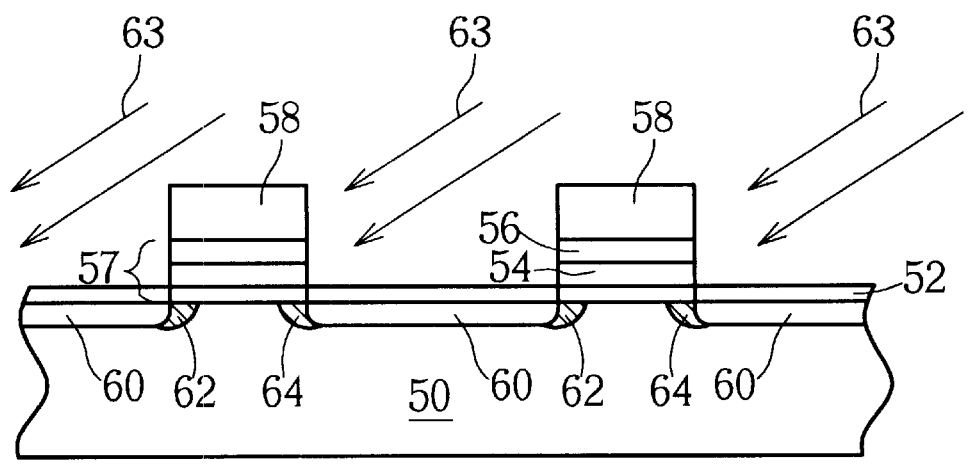

Please refer to FIG. 7 and FIG. 8. FIG. 7 and FIG. 8 are cross-sectional diagrams of a method for performing a pocket implantation process on an NROM according to the present invention. As shown in FIG. 7, an NROM cell is formed on a silicon substrate 50. The NROM cell comprises an oxide-nitride-oxide (ONO) layer 57 formed on the silicon substrate 50. The ONO layer 57 is comprised of a bottom oxide layer 52, a silicon nitride layer 54 and a top oxide layer 56. A plurality of bit line masks 58 arranged in a column is formed on the surface of the ONO layer 57. A plurality of N-type bit lines 60 is formed in the region of the substrate 50 not covered by the bit line masks 58.

Following this, a pocket implantation process 61 is performed on one side of the region of the substrate SO not covered by the bit line masks 58 to implant a plurality of P-type ultra-shallow doped areas 62. As shown in FIG. 8, another pocket implantation process 63 is performed on the other side of the region of the substrate 50 not covered by the bit line masks 58 to implant a plurality of P-type ultra-shallow doped areas 64. The pocket implantation processes 61 and 63 have approximately the same ion implantation parameters, however the processes utilize different injection angles. The pocket implantation processes 61 and 63 both use Indium ions as dopants, the dosage ranging from $0.75 \times 10^{13}/cm^2$ to $2.5 \times 10^{13}/cm^2$, and the energy ranging from 10 KeV to 60 KeV. The injection angle between the silicon substrate 50 ranges from 10° to 25°. Finally, the Indium ions in the ultra-shallow doped areas 62 and 64 are activated, so as to form an ultra-shallow junction on the surface of the silicon substrate 50.

The pocket implantation process according to the present invention is an ion implant process using a low energy and a high dosage, so as to prevent electron secondary injection in the pocket implantation process.

In contrast to the prior art method of forming an NROM, the present invention uses Indium ions as dopants in the pocket implantation process. Therefore, electron secondary injection, caused by using boron ions as dopants in the prior art, is eliminated so as to facilitate faster programming and shorter erase time.

Those skilled in the art will readily observe that numerous modifications and alterations of the device may be made while retaining the teachings of the invention. Accordingly, the above disclosure should be constructed as limited only by themetes and bounds of the appended claims.

What is claimed is:

1. A method for preventing electron secondary injection in a pocket implantation process, the pocket implantation process performed to form a nitride read only memory (NROM), the NROM comprising an oxide-nitride-oxide (ONO) layer formed on a silicon substrate, and a plurality of bit line masks having a columnar arrangement formed on the surface of the ONO layer, a plurality of N-type bit lines formed in a region of the substrate that is not covered by the bit line masks, the method comprising:

performing a pocket implantation process that uses Indium ions and an implantation angle to the ONO layer to perform an implantation to the region of the substrate that is not covered by the bit line masks to form a plurality of P-type ultra-shallow doped areas; and activating the Indium ions in the ultra-shallow doped area so as to form an ultra-shallow junction on the surface of the silicon substrate;

wherein the pocket implantation process is an ion implantation process that uses a low energy and a high dosage to prevent electron secondary injection in the pocket implantation process.

2. The method of claim 1 wherein the ONO layer is composed of a bottom oxide layer, a silicon nitride layer and a top oxide layer.

3. The method of claim 1 wherein the implantation angle ranges from 10° to 25°, the dosage ranges from $0.75 \times 10^{13}/cm^2$ to $2.5 \times 10^{13}/cm^2$, and the energy ranges from 10 to 60 KeV.

4. A method of forming an ultra-shallow junction on the surface of a semiconductor wafer, the semiconductor wafer comprising a plurality of nitride read only memory (NROM) cells positioned on a substrate of the semiconductor wafer, and a plurality of buried bit lines formed in the substrate adjacent to the NROM cells, the method comprising:

performing a pocket implantation process that uses Indium ions and an implantation angle to the ONO layer to perform an implantation to a region of the substrate not covered by the bit line masks for forming a plurality of P-type ultra-shadow doped areas; and activating the Indium ions in the ultra-shallow doped areas so as to form a plurality of ultra-shadow junctions on the surface of the silicon substrate.

5. The method of claim 4 wherein ultra-shallow junction is used as a pocket implantation region.

6. The method of claim 4 wherein the ion implantation process uses a low energy and a high dosage to prevent electron secondary injection in the ion implantation process so as to enhance a programming speed of the NROM and decrease an erase time.

7. The method of claim 4 wherein the implantation angle ranges from 10° to 25°, the dosage ranges from $0.75 \times 10^{13}/cm^2$ to $2.5 \times 10^{13}/cm^2$, and the energy ranges from 10 to 60 KeV.

* * * * *